(12) United States Patent
Niinobe

(10) Patent No.: US 6,508,940 B1
(45) Date of Patent: Jan. 21, 2003

(54) PROCESS FOR RECOVERING ONIUM HYDROXIDES FROM SOLUTIONS CONTAINING ONIUM COMPOUNDS

(75) Inventor: Takao Niinobe, Nara Prefecture (JP)

(73) Assignee: Sachem, Inc., Austin, TX (US)

( * ) Notice: Subject to any disclaimer, the term of this patent is extended or adjusted under 35 U.S.C. 154(b) by 28 days.

(21) Appl. No.: 09/693,293

(22) Filed: Oct. 20, 2000

(51) Int. Cl.$^7$ .................................................. C02F 1/42
(52) U.S. Cl. ...................... 210/681; 210/670; 210/685; 252/184
(58) Field of Search ................................ 210/681, 670, 210/685; 252/184

(56) References Cited

U.S. PATENT DOCUMENTS

| | | | | |
|---|---|---|---|---|
| 4,394,226 A | * | 7/1983 | Wade et al. | 204/72 |
| 4,572,769 A | | 2/1986 | Shimuzu | 204/59 |
| 4,634,509 A | | 1/1987 | Shimuzu et al. | 204/182.4 |
| 4,714,530 A | | 12/1987 | Hale et al. | 204/131 |
| 4,880,513 A | | 11/1989 | Davis et al. | 204/182.4 |
| 4,917,781 A | | 4/1990 | Sharifian et al. | 204/72 |
| 4,938,854 A | | 7/1990 | Sharifian et al. | 204/130 |
| 5,286,354 A | | 2/1994 | Bard et al. | 204/86 |
| 5,352,345 A | | 10/1994 | Byszewski et al. | 204/182.4 |
| 5,354,434 A | | 10/1994 | Satoh et al. | 204/72 |
| 5,389,211 A | | 2/1995 | Sharifian et al. | 204/72 |
| 5,405,508 A | | 4/1995 | Kawakami et al. | 204/102 |
| 5,439,564 A | | 8/1995 | Shimuzu et al. | 204/102 |
| 5,545,309 A | | 8/1996 | Shimuzu et al. | 205/437 |
| 5,709,790 A | | 1/1998 | Sharifian et al. | 205/437 |
| 5,833,832 A | | 11/1998 | Shay et al. | 205/413 |
| 5,874,204 A | * | 2/1999 | Sugawara et al. | 430/399 |
| 5,968,338 A | | 10/1999 | Hulme et al. | 205/703 |
| 6,083,670 A | | 7/2000 | Sugawara et al. | 430/399 |
| 6,187,519 B1 | * | 2/2001 | Sugawara | 430/399 |
| 6,217,743 B1 | * | 4/2001 | Moulton et al. | 205/746 |

FOREIGN PATENT DOCUMENTS

| | | | | |
|---|---|---|---|---|
| JP | 60131985 | 7/1985 | | C25B/3/00 |
| JP | 60131986 | 7/1985 | | C25B/3/00 |
| JP | 4228587 | 8/1992 | | C25B/3/04 |
| JP | 5106074 | 4/1993 | | H01L/21/027 |

* cited by examiner

*Primary Examiner*—Joseph D. Anthony
(74) *Attorney, Agent, or Firm*—Renner, Otto, Boisselle & Sklar, LLP

(57) ABSTRACT

In one embodiment the present invention is a process for recovering an onium hydroxide from a cation exchange material having onium cations adsorbed thereto which comprises (A) contacting said cation exchange material with an aqueous solution of a base selected from alkali metal hydroxides and ammonium hydroxide to form an onium hydroxide, and (B) recovering an aqueous solution of the onium hydroxide.

In another embodiment, the present invention relates to a process for recovering an onium hydroxide from a solution containing an onium compound such as an onium hydroxide and/or onium salt, including contacting the solution with a cation exchange material so that at least a portion of onium cations from the onium compound are adsorbed by the cation exchange material; contacting the cation exchange material having the onium cations adsorbed thereto with an aqueous solution of an inorganic base to form an onium hydroxide; and recovering the onium hydroxide solution. The onium hydroxides that can be recovered in this manner include quaternary ammonium hydroxides, quaternary phosphonium hydroxides, and tertiary sulfonium hydroxides.

In another embodiment, the present invention relates to a process for recovering tetraalkylammonium hydroxides from waste solutions containing a tetraalkylammonium compound, including contacting the waste solution with a cation exchange material so that at least a portion of the tetraalkylammonium cations from the tetraalkylammonium compound are adsorbed by the material; contacting an inorganic base with the cation exchange material to whereby a tetraalkylammonium hydroxide is formed; and recovering tetraalkylammonium hydroxide solution.

36 Claims, No Drawings

PROCESS FOR RECOVERING ONIUM HYDROXIDES FROM SOLUTIONS CONTAINING ONIUM COMPOUNDS

TECHNICAL FIELD

This invention relates to processes for regenerating onium hydroxides from solutions containing onium compounds. In particular, the invention relates to processes for recovering onium hydroxides from solutions containing onium hydroxides and/or onium salts using a cation exchange material and a base.

BACKGROUND OF THE INVENTION

Onium hydroxides, such as quaternary ammonium hydroxides including tetramethylammonium hydroxide (TMAH) and tetraethylammonium hydroxide (TEAH), are strong organic bases that have been known for many years. Quaternary ammonium hydroxides have found a variety of uses including use in zeolite manufacture and polymer manufacture. Aqueous solutions of quaternary ammonium hydroxides, particularly TMAH solutions, have also been used extensively as a developer for photoresists in printed circuit board and microelectronic chip fabrication. For a variety of reasons, it is desirable to minimize the overall amount of developer used in printed circuit board and microelectronic chip fabrication. One way to minimize the overall amount of hydroxide developer is to reuse the waste developer. Reusing developer reduces the amount lost and decreases disposal problems.

Waste developer contains impurities including ionic impurities and nonionic impurities. Ionic impurities include various metal cations such as sodium, potassium, zinc, nickel, aluminum, copper and calcium; and anions such as halides, nitrates, nitrites, carbonates, carboxylates, sulfates. Nonionic impurities include photoresists, surfactants, amines and numerous other organic molecules. Waste developer also contains relatively low concentrations of the hydroxide developer. Accordingly, there remains a continuing need to effectively recover hydroxide developer in a useable form so that it may be reused thereby minimize the overall amount of developer used in printed circuit board and microelectronic chip fabrication.

U.S. Pat. No. 4,714,530 (Hale et al) describes an electrolytic process for preparing high purity quaternary ammonium hydroxides which utilizes a cell containing a catholyte compartment and an anolyte compartment separated by a cation-exchange membrane. The process comprises charging an aqueous solution of a quaternary ammonium hydroxide to the anolyte compartment, adding water to the catholyte compartment, and passing a direct current through the electrolysis cell to produce a higher purity quaternary ammonium hydroxide in the catholyte compartment which is subsequently recovered. The '530 patent also describes an improvement which comprises heating the quaternary ammonium hydroxide at an elevated temperature prior to charging the hydroxide to the anolyte compartment of the electrolytic cell.

U.S. Pat. No. 4,938,854 (Sharifian et al) also describes an electrolytic process for purifying quaternary ammonium hydroxides by lowering the latent halide content. The electrolytic cell may be divided into an anolyte compartment and a catholyte compartment by a divider which may be an anion or cation selective membrane. The cathode in the catholyte compartment comprises zinc, cadmium, tin, lead, copper or titanium, or alloys thereof, mercury or mercury amalgam.

Japanese Kokai Patent No.60-131985 (1985) (Takahashi et al) describes a method of manufacturing a high purity quaternary ammonium hydroxide in an electrolysis cell which is divided into an anode chamber and a cathode chamber by a cation exchange membrane. A quaternary ammonium hydroxide solution containing impurities is charged to the anode chamber and a direct current is supplied between two electrodes after water has been charged to the cathode chamber. Purified quaternary ammonium hydroxide is obtained from the cathode chamber. The purified quaternary ammonium hydroxide contains reduced amounts of alkali metals, alkaline earth metals, anions, etc.

U.S. Pat. Nos. 5,439,564 and 5,545,309 (Shimizu et al) relate to methods of processing waste liquid containing an organic quaternary ammonium hydroxide by contacting the waste liquid with a cation-exchanging material, eluting organic quaternary ammonium cations from the cation-exchanging material, and electrolyzing the eluate in a two chamber electrolytic cell equipped with an anode, cathode and cation-exchanging membrane. Organic quaternary ammonium hydroxide is obtained from the cathode chamber of the electrolytic cell.

U.S. Pat. No. 5,968,338 (Hulme et al) describes a process for regenerating onium hydroxides from solutions containing onium compounds such as hydroxides and salts using a cation exchange material, an acid to form a salt, and an electrochemical cell comprising at least three compartments to regenerate the onium hydroxide.

SUMMARY OF THE INVENTION

In one embodiment the present invention is a process for recovering an onium hydroxide from a cation exchange material having onium cations adsorbed thereto which comprises (A) contacting said cation exchange material with an aqueous solution of a base selected from alkali metal hydroxides and ammonium hydroxide to form an onium hydroxide, and (B) recovering an aqueous solution of the onium hydroxide.

In another embodiment, the present invention relates to a process for recovering an onium hydroxide from a solution containing an onium compound such as an onium hydroxide and/or onium salt, including contacting the solution with a cation exchange material so that at least a portion of onium cations from the onium compound are adsorbed by the cation exchange material; contacting the cation exchange material having the onium cations adsorbed thereto with an aqueous solution of an inorganic base to form an onium hydroxide; and recovering the onium hydroxide solution. The onium hydroxides that can be recovered in this manner include quaternary ammonium hydroxides, quaternary phosphonium hydroxides, and tertiary sulfonium hydroxides.

In another embodiment, the present invention relates to a process for recovering tetraalkylammonium hydroxides from waste solutions containing a tetraalkylammonium compound, including contacting the waste solution with a cation exchange material so that at least a portion of the tetraalkylammonium cations from the tetraalkylammonium compound are adsorbed by the cation exchange material; contacting an inorganic base with the cation exchange material whereby a tetraalkylammonium hydroxide is formed; and recovering tetraalkylammonium hydroxide solution.

As a result of the process of the present invention, recycled solutions of onium hydroxides can be obtained in which the concentration and purity is increased. Recycling spent solutions of onium hydroxides provides not only cost savings, but also environmental benefits by eliminating or reducing the need for synthesizing new hydroxide compound solutions, the associated expensive purification processes, and the toxicity of waste solution effluents. Additionally, it is not necessary to store large amounts of chemicals. The relatively high concentration and purity of onium hydroxide solutions obtainable via the present invention can effectively be used in numerous applications where onium hydroxide solutions are required.

DESCRIPTION OF THE PREFERRED EMBODIMENTS

In one embodiment of the invention, onium hydroxides are recovered from a cation exchange material having onium cations adsorbed thereto which comprises
 (A) contacting said cation exchange material with an aqueous solution of a base selected from alkali metal hydroxides and ammonium hydroxide to form an onium hydroxide, and
 (B) recovering an aqueous solution of the onium hydroxide.
This process is described in more detail below.

In another embodiment of the present invention, onium hydroxides are regenerated (produced, purified or recycled) from solutions containing an onium compound such as onium hydroxides and/or onium salts. In one embodiment, the solution containing an onium compound is a waste solution of an onium hydroxide after it has been used in a process, such as a developing processes associated with printed circuit board and microelectronic chip fabrication. As a result of such processes, impurities enter and contaminate the solution. In other words, the solution containing an onium compound may be a spent waste solution of an onium hydroxide. In another embodiment, the solution containing an onium compound is a waste solution of an onium salt after it has been used in a process. The solution or waste solution may contain other compounds, such as the impurities described above and below.

The solutions containing onium compounds which are treated in accordance with the process of the present invention are mixtures, preferably solutions, containing an oxidizable liquid and from about 0.01% to about 50% by weight of the onium compound and, generally, varying amounts of one or more undesirable impurities, for example, anions such as halide, carbonate, formate, acetate, nitrite, nitrate, sulfate, etc., some cations such as metals including zinc and calcium, sodium, potassium and some neutral species such as photoresists, methanol, amines, etc. The oxidizable liquid may be water, mixtures of water and an organic liquid, or an organic liquid. Organic liquids include alcohols, such as methanol and ethanol, glycols and the like. In one embodiment, the solutions treated in accordance with this invention contain from about 0.01 to about 10% by weight of the onium compound. Here and elsewhere in the specification and claims, the range and ratio limits may be combined.

In one embodiment, the process of the present invention is effective in reducing the amount of both ionic and nonionic impurities present in solutions of onium compounds, while yielding onium hydroxides of high purity. In a further embodiment, the process of the present invention results in a reduction of metal ion impurities as well as organic impurities in a solution of an onium compound, while yielding onium hydroxides of high purity. In another embodiment the process of the present invention is useful in preparing purified onium hydroxides such as quaternary ammonium hydroxides, quaternary phosphonium hydroxides and tertiary sulfonium hydroxides.

The onium hydroxides may generally be characterized by the formula

wherein A is an onium group and x is an integer equal to the valence of A. Examples of onium groups include ammonium groups, phosphonium groups, and sulfonium groups. In one embodiment, the onium hydroxide should be sufficiently soluble in a solution such as water, alcohol or other organic liquid, or mixtures thereof to permit a useful recovery rate.

The quaternary ammonium hydroxides and quaternary phosphonium hydroxides may be characterized by the formula

wherein A is a nitrogen or phosphorus atom, $R^1$, $R^2$, $R^3$ and $R^4$ are each independently alkyl groups containing from 1 to about 20, or 1 to about 10 carbon atoms, hydroxyalkyl or alkoxyalkyl groups containing from 2 to about 20, or 2 to about 10 carbon atoms, aryl groups or hydroxyaryl groups, or $R^1$ and $R^2$ together with A may form a heterocyclic group provided that if the heterocyclic group contains a C=A group, $R^3$ is the second bond.

The alkyl groups $R^1$ to $R^4$ may be linear or branched, and specific examples of alkyl groups containing from 1 to 20 carbon atoms include methyl, ethyl, propyl, butyl, pentyl, hexyl, heptyl, octyl, isooctyl, nonyl, decyl, isodecyl, dodecyl, tridecyl, isotridecyl, hexadecyl and octadecyl groups. $R^1$, $R^2$, $R^3$ and $R^4$ also may be hydroxyalkyl groups containing from 2 to 5 carbon atoms such as hydroxyethyl and the various isomers of hydroxypropyl, hydroxybutyl, hydroxypentyl, etc. In one embodiment, $R^1$, $R^2$, $R^3$ and $R^4$ are independently alkyl groups containing 1 to about 4 or 5 carbon atoms and/or hydroxyalkyl groups containing from two to three carbon atoms. Specific examples of alkoxyalkyl groups include ethoxyethyl, butoxymethyl, butoxybutyl, etc. Examples of various aryl and hydroxyaryl groups include phenyl, benzyl, and equivalent groups wherein benzene rings have been substituted with one or more hydroxy groups.

The quaternary onium salts which can be treated in accordance with the present invention are characterized by the Formula III

wherein A, $R^1$, $R^2$, $R^3$ and $R^4$ are as defined in Formula II, X is an anion of an acid, and y is a number equal to the valence of X. Examples of anions of acids include bicarbonates, halides, nitrates, formates, acetates, sulfates, carbonates, phosphates, etc.

The quaternary ammonium compounds (hydroxides and salts) which can be treated in accordance with the process of the present invention may be represented by Formula IV.

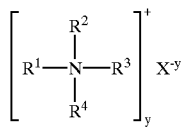
(IV)

wherein $R^1$, $R^2$, $R^3$, $R^4$, and y are as defined in Formula III, and X is a hydroxide anion or an anion of an acid. In one embodiment, $R^1$–$R^4$ are alkyl groups containing from 1 to about 4 carbon atoms and hydroxyalkyl groups containing 2 or 3 carbon atoms. Specific examples of ammonium hydroxides include tetramethylammonium hydroxide (TMAH), tetraethylammonium hydroxide (TEAH), tetrapropylammonium hydroxide, tetrabutylammonium hydroxide, tetra-n-octylammonium hydroxide, methyltriethylammonium hydroxide, diethyldimethylammonium hydroxide, methyltripropylammonium hydroxide, methyltributylammonium hydroxide, cetyltrimethylammonium hydroxide, trimethylhydroxyethylammonium hydroxide, trimethylmethoxyethylammonium hydroxide, dimethyldihydroxyethylammonium hydroxide, methyltrihydroxyethylammonium hydroxide, phenyltrimethylammonium hydroxide, phenyltriethylammonium hydroxide, benzyltrimethylammonium hydroxide, benzyltriethylammonium hydroxide, dimethylpyrolidinium hydroxide, dimethylpiperi-dinium hydroxide, diisopropylimidazolinium hydroxide, N-alkylpyridinium hydroxide, etc. In one embodiment, the quaternary ammonium hydroxides treated in accordance with this invention are TMAH and TEAH. The quaternary ammonium salts represented by Formula IV may be similar to the above quaternary ammonium hydroxides except that the hydroxide anion is replaced by, for example, a sulfate anion, a chloride anion, a carbonate anion, a formate anion, a phosphate ion, etc. For example, the salt may be tetramethylammonium chloride, tetramethylammonium sulfate (y=2), tetramethylammonium bromide, 1 methyl-2-butyl imidazolium hexafluorophosphate, n-butyl pyridinium hexafluorophosphate, etc.

Examples of quaternary phosphonium salts representative of Formula II wherein A=P which can be treated in accordance with the process of the present invention include tetramethylphosphonium hydroxide, tetraethylphosphonium hydroxide, tetrapropylphosphonium hydroxide, tetrabutylphosphonium hydroxide, trimethylhydroxyethylphosphonium hydroxide, dimethyldihydroxyethylphosphonium hydroxide, methyltrihydroxyethylphosphonium hydroxide, phenyltrimethylphosphonium hydroxide, phenyltriethylphosphonium hydroxide and benzyltrimethylphosphonium hydroxide, etc, and the corresponding halides, sulfates, carbonates, phosphates, etc.

In another embodiment, the tertiary sulfonium hydroxides and salts which can be recycled or purified in accordance with this invention may be represented by the formula

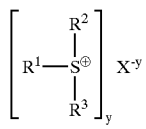
(V)

wherein $R^1$, $R^2$ and $R^3$, X and y are as defined in Formula III.

Examples of the tertiary sulfonium compounds represented by Formula V include trimethylsulfonium hydroxide, triethylsulfonium hydroxide, tripropylsulfonium hydroxide, etc, and the corresponding salts such as the halides, sulfates, nitrates, carbonates, etc.

Onium hydroxides are commercially available. Additionally, onium hydroxides can be prepared from the corresponding onium salts such as the corresponding onium halides, carbonates, formates, sulfates and the like. Various methods of preparation are described in U.S. Patents 4,917,781 (Sharifian et al) and 5,286,354 (Bard et al) which are hereby incorporated by reference. There is no particular limit as to how the onium hydroxide is obtained or prepared.

Prior to contact with a cation exchange material, the solutions containing the onium hydroxide and/or onium salts and/or impurities may be optionally concentrated or otherwise pretreated. That is, the concentration of the onium hydroxide and/or onium salt in the solution may be increased prior to contact with the cation exchange material and/or various impurities may be removed from the onium compound solution.

In some embodiments, it is useful to concentrate the solution of the onium hydroxide and/or onium salt prior to contact with the cation exchange material. Concentration procedures are known to those skilled in the art and include evaporation, distillation, nanofiltration and reverse osmosis among others.

In other embodiments, it is useful to pretreat the solution of the onium compound with some form of filtration prior to contact with the cation exchange material in accordance with the invention. Various types of filtration can be performed including gravity filtration, microfiltration such as nanofiltration, cross-flow filtration, cartridge filtration, vacuum filtration and pressure induced filtration. Related straining and screening pretreatments may also be performed. Filter membranes can be made of known materials useful for separating solids from liquids including plastics such as PTFE, PVDF, PET, nylons, polyethylene and polypropylene, cellulose acetate, cellulose nitrate, regenerated cellulose, nitrocellulose, paper including ashless paper, various fibers including glass fibers, and various particulates including activated carbon, silica, sand, etc. Alternatively, pretreatment can involve contacting the solution of the onium compound with various particulate materials, for example activated carbon, so that organic impurities are adsorbed and thus removed from solution by the particulate material.

In some embodiments, more than one type (or pass) of a filtration pretreatment can be performed as each filtration pretreatment may remove a different species of impurity. For example, in one embodiment two filtration pretreatments are performed: organic impurities are substantially or partially removed by gravity filtration and metal impurities are substantially or partially removed by another pass of gravity filtration after increasing the pH of the solution causing certain metals to form insoluble hydroxide salts thereby facilitating filtration (and thus separation of the insoluble species).

In other embodiments, it is preferable to pretreat the solution of the onium compound with some form of metal treatment prior to contact with the cation exchange material in accordance with the invention. A metal pretreatment removes excess metal impurities from the solution of the onium compound. In one embodiment, metal pretreatment involves contacting a solution of the onium compound with a preliminary ion exchange material for metal removal. The preliminary ion exchange material is preferably a preliminary cation exchange material which can selectively discriminate between metal cations and onium cations so that at least a portion of metal ion impurities in the solution of the onium compound is adsorbed by the preliminary ion exchange material. For example, a preliminary ion exchange material, for which sodium has an affinity, can be used as a metal pretreatment to remove sodium from the solution of the onium compound prior to contact with the cation exchange material in accordance with the invention.

In another embodiment, metal pretreatment involves contacting a solution of the onium compound with a metal complexing compound. Metal complexing compounds adsorb, bond to, complex, coordinate, chelate or otherwise engage at least a portion of the metal ion impurities in the solution of the onium compound thereby removing them prior to contact with the cation exchange material in accordance with the invention. Examples of metal complexing compounds include crown ethers, cryptands and chelating compounds (diamines, diketonates, etc).

In yet another embodiment, metal pretreatment involves contacting a solution of the onium compound with an acid or salt capable of forming an insoluble precipitate (at least partially insoluble) with a metal cation thereby enabling easy removal of the precipitate and thus the metal from solution prior to contact with the cation exchange material in accordance with the invention.

According to the present invention, a solution containing an onium compound is contacted with a first cation exchange material so that the cation exchange material adsorbs onium cations from the solution (cations derived from onium hydroxide and/or onium salt). The cation exchange material may be any ion exchange material which efficiently adsorbs onium cations derived from onium compounds. The cation exchange material may be either a weakly acidic cation exchange material or a strongly acidic cation exchange material. The base of the cation exchange material may be either an organic cation exchange material such as a cation exchange resin or an inorganic cation exchange material such as zeolite, silica gel or the like.

The cation exchange material may be in the form of a powder, pellets, granules, films and/or fibrous materials. Two or more cation exchange materials may be combined, for example, as a combination of a weakly acidic cation exchange material and a strongly acidic cation exchange material, a combination of an inorganic cation exchange material and an organic cation exchange material, a combination of two or more cation exchange materials each in a different form, such as a powder and a fiber, depending upon the identity and properties of the onium compound solution. Given the handability, economical aspects and ion-exchange capacity of the cation exchange materials, preferred are granular weakly acidic cation exchange resins and/or strongly acidic cation exchange resins. In one embodiment, cation ion exchange materials in the hydronium ion (H+) form are employed in the present invention.

Examples of useful cation exchange materials include gelled or porously-shaped cation exchange resins produced by introducing sulfonic acid groups or carboxylic acid groups into a polymer or copolymer base of, for example, styrenic polymers or copolymers such as polystyrene and the like, acrylic polymers or copolymers such as polyacrylic resins and the like, methacrylic polymers and copolymers such as polymethacrylic resins and the like and tetrafluoroethylenic polymers or copolymers such as polytetrafluoroethylene and the like, or into a modified polymer or copolymer base to be prepared by modifying the polymers or copolymers with a crosslinking agent such as divinylbenzene or the like. The cation exchange materials further include phosphoric and phosphorous acid resins as well as inorganic cation exchange materials such as zeolite, silica gel and the like.

Specific examples include cation exchange resins sold under the trade designations AMBERLITE® and DOWEX® from Rohm & Haas Co. and Dow Chemical Co., respectively. More specific examples include: exchange resins under the trade designation AMBERLITE, such as IR-100, IR-105, IR-105 G, IR-112, IR-120, IR-122, IR-124, IRC-50, IRC-76, and IRC-84SP; resins under the trade designation DUOLITE, such as C-280, C-291, C-433 and C-464 from Rohm & Haas Co.; C-464 from Sumitomo Chemical Co.; resins under the trade designation DOWEX, such as HGRW2, HCR-S, HGRW2, MWC-1, 50WX2, 50WX4, and 50WX8 and resins under the trade designation MONOSPHERE DOWEX, such as C350, C500 and C650 from Dow Chemical Co.; Ionac CC and C-267 from Sybron; various cation exchange resins from Organo Co.; and those under the designation DIAION, such as PK216H, PK212, PK 228, HPK25, SK-1 BS, SK-104, SK-112, SK-112, SK-116, WK10, WK11, WK20, WK40 and WK100 from Mitsubishi Kasei Corp; and Lewatit CNP80 from Bayer. In one embodiment, the cation exchange resin is at least one of IRC-84SP from Rohm & Haas Co.; MONOSPHERE DOWEX C350, C500 and C650 from Dow Chemical Co.; PK216H, PK212 and WK40 from Mitsubishi Kasei Corp and Lewatit CNP80 from Bayer.

Any known method may be employed, in accordance with the identity and form of the cation exchange material, for contacting the solution containing an onium hydroxide and/or an onium salt with the cation exchange material. For instance, a column system may be employed where the solution containing the onium compound is passed through a column filled with a cation exchange material. Alternatively a batch system may be utilized where a cation exchange material is added to the solution containing the onium compound so that the latter is brought into contact with the former by stirring, and thereafter the mixture is filtered for solid-liquid separation.

The cation exchange material with the adsorbed onium cations is then contacted with a solution of an inorganic base such as an alkali metal hydroxide or ammonium hydroxide whereby the adsorbed onium cations are eluted and removed therefrom forming a solution of the desired onium hydroxide. In embodiments where a column system is employed, the base may be added to the column in a co-current or countercurrent fashion.

The basic aqueous solutions useful in this invention may be a solution of an inorganic base. In one embodiment the inorganic base is an alkali metal hydroxide or ammonium hydroxide. In another embodiment, the base is a strong base of an alkali metal selected from sodium hydroxide, potassium hydroxide and lithium hydroxide. The concentration of the base in the aqueous solution may vary over a wide range, and generally the aqueous solutions will contain from about 5%w to about 20 or 25% w of the base. In one embodiment, the concentration of the base is from about 5 to about 12%.

When the onium hydroxide is eluted from the cation ion exchange material containing the onium cations, it is desirable to minimize the amount of alkali metal or ammonium hydroxide collected. It is possible to reduce the amount of base collected by varying the flow rate of the basic solution and the concentration of the base contacting the cation exchange material. When ion exchange columns are used, desirable flow rates and concentrations vary depending on the identity of the cation exchange material as well as the identity of the base. Flow rates an concentration a levels can be determined in each instance by those skilled in the art.

One of the advantages of utilizing ion exchange columns, as opposed to a batch process, is that the process can be conducted as a semi-continuous process whereby a given quantity of the solution containing the onium hydroxide and/or salt is pumped through the ion exchange column, and the effluent can be collected as two or more fractions. For example, the effluent can be divided in three fractions: the first fraction will contain only small amounts of the onium hydroxide; the second fraction will contain a relatively high concentration of the onium hydroxide; and the third fraction (tail) will contain a lesser amount of the onium hydroxide. The first and third fractions can be discarded as waste or reused as described elsewhere in the specification. For example, the first and third fraction can be reused as a source of the inorganic base.

For the sake of brevity, the discussion which follows will relate to the situation where three fractions are collected as described above, and the middle fraction which contains a high concentration of the onium hydroxide (e.g., from 8 to about 15 or 20 percent by weight) is considered the product of the process.

Another advantage of the process of the present invention is that the process as described above results in the formation and recovery of an onium hydroxide directly. In some of the prior art processes as described earlier, the cation exchange materials which have adsorbed onium cations are treated with an acid thus producing an onium salt which must then be treated utilizing an expensive electrolysis or electrodialysis process to convert the salt into the desired hydroxide. Consequently, the process of the present invention is more economical than the prior art processes because it eliminates the most expensive step in the prior processes.

In some instances, the onium hydroxide solution recovered from the cation exchange resin in accordance with the above process of the present invention contains some of the base material as an impurity, and the concentration of the onium hydroxide in the aqueous solution may not be at an acceptable level for all applications. In accordance with one embodiment of the present invention, the onium hydroxide which is recovered from the above process (e.g., from the first ion exchange column) may contain unwanted impurities and/or an insufficient concentration of the onium hydroxide. The level of impurities may be reduced and the concentration of the onium hydroxide increased by contacting the solution obtained from the above process (first column) with a second cation exchange material which is in the corresponding onium cation form. That is, if the onium hydroxide being purified by contact with a second cation exchange material is TMAH, the cation exchange resin in the purification step should be in the TMA cation form. The cation exchange resin in the TMA cation form can be prepared by contacting a cation exchange material with aqueous solution containing TMAH. The solution containing TMAH utilized for this purpose may be a waste stream containing TMAH, or an aqueous solution of TMAH containing a higher concentration of TMAH. The source of TMAH could also be one of the first or third fractions of the effluent from the first cation exchange column. As should be apparent, the second column containing cation exchange materials with onium cations adsorbed thereon, can be formed in the same manner as the first cation exchange column having onium cations adsorbed thereon. Thus, in one embodiment, the practice of the invention could proceed as follows:

1) provide several columns in parallel containing a cation exchange resin in hydronium form;

2) contact an aqueous solution containing a small amount (e.g., 0.5 w %) of TMAH with the cation exchange resin in hydronium form contained in the first column;

3) the effluent is discarded, and when the resin capacity of the cation exchange resin in column 1 is exhausted, the flow of the waste material into column 1 is terminated and diverted to column 2;

4) the aqueous solution containing TMAH is added to column 2 until the resin capacity of the resin contained in column 2 is exhausted whereupon the flow of the aqueous solution containing TMAH is diverted to column 3. This process is repeated in column 4, etc. until the aqueous solution is depleated;

5) when the resin capacity in column 1 has been exhausted and the aqueous TMAH solution has been diverted to a different column, an aqueous base solution as described above is then added to column 1 to elute the TMAH from the resin and to form an aqueous solution of TMAH which contains fewer impurities and a higher concentration of TMAH than the initial solution.

The TMAH solution (or fraction thereof) which is collected as effluent of the first column can then be further purified and concentrated by contacting the solution with the cation exchange resin in column 2 which now contains TMA cations adsorbed thereto. In this step, the second column becomes a purification column. Sodium cations present in the TMAH solution recovered from column 1 are adsorbed onto the resin in exchange for TMA cations forming additional TMAH. The TMAH solution recovered from the second column (i.e., the purification column) has significantly reduced levels of sodium and other cation impurities. Generally, the levels of sodium and other cation impurities are in the hundreds of parts per billion range, and this material will meet the specification for some users of TMAH. The concentration of TMAH is increased in the solution recovered from the second column in one example, to about 15% w.

In one embodiment of the present invention, the effluent fractions which contain small but significant amounts of the base and the onium hydroxide (e.g., from about 3 to 5% of sodium hydroxide and 3 to 4% of TMAH), can be recovered and used as makeup for the higher concentration base solutions that are used to elute the columns. For example, concentrated sodium hydroxide in the form of sodium hydroxide crystals (99+percent sodium hydroxide) or in the form of a commercially available sodium hydroxide concentrate (50% sodium hydroxide, can be added to the effluent containing 3 to 4% sodium hydroxide to provide a desired concentration of, for example, about 10% sodium hydroxide, for use as the base solution for eluting the TMAH from a column wherein TMA cations have been adsorbed by the cation exchange material. The ability to recover and utilize the basic solutions containing 3 to 5% sodium hydroxide results in a significant reduction in disposal problems, reduces the waste of sodium hydroxide, and reduces the cost and amount of sodium hydroxide required for the overall process.

Also, since metal or ammonium ions from the base replace the onium ions on the cation exchange material, the cation exchange material can be regenerated (i.e., returned to hydronium or proton form) easily for reuse by contacting with an acid. The acid used to regenerate the cation exchange material may be selected from inorganic acids such as hydrochloric acid, hydrobromic acid, nitric acid, sulfuric acid, carbonic acid, phosphoric acid, phosphorous acid and the like, and organic acids such as acetic acid, formic acid, oxalic acid and the like. In one embodiment, the acid has a $pK_a$ of less than about 5, and preferably a $PK_a$ of less than about 4. The concentration of the acid may vary broadly, and it may be selected from a broad range form above about 0.01% to above about 20%. In one embodiment, the acid is preferably an inorganic acid. Particular examples of useful acids include carbonic acid, hydrochloric acid or a diluted sulfuric acid having a concentration from above about 0.05% or above about 2.0%.

An acid is contacted with the spent cation exchange material thereby removing the metal ions (e.g., sodium ions) and forming a water soluble metal salt metal. The metal salt eluted from the cation exchange material is at least partially constituted by a compound containing an metal cation (derived from the base solution initially contacted with the spent cation exchange material) and an anion (derived from the acid used to regenerate the spent cation exchange material).

In some instances, it is desired to further purify the onium hydroxide solution which is obtained when the onium hydroxide solution recovered from the first cation exchange column is passed through a second cation exchange column. For example it may be desired to further purify the onium hydroxide for particular electronic applications. It may be desired, for example, to remove metal ion impurities (e.g., $Na^+$). In order to further purify the onium hydroxide solution so that it will be usable in ultra pure applications such as in semi conductor fabrications, the solution may be contacted with an anion exchange material in hydroxide ion form and/or a third cation exchange material in onium ion form. Alternatively, in lieu of or in addition to the third cation ion exchange material, the onium hydroxide solution can be contacted with a metal ion scavenger which may comprise at least one of a chelating compound, a nanoporous material, and a magnetically assisted chemical separation (MACS) material. This process and the metal ion scavengers useful in the process are described in detail in copending U.S. application Ser. No. 09/370,682 (Moulton et al). Alternatively, metal ions can be removed by contacting the recovered onium hydroxide solution with an acid or salt capable of forming an insoluble precipitate (at least partially insoluble) with a metal cation thereby enabling easy removal of the precipitate and thus the metal cations from the onium hydroxide solution product. These additional purification steps are referred to herein as "ultrapurification".

When both of an anion exchange resin and a cation exchange resin are used as the ion exchange material, the anion exchange resin and the cation exchange resin may be mixed with each other and used in the form of a mixed ion exchange resin packed in a column or a tower. However, the combination is preferably used in the form of a stratified structure packed in a column or a tower, wherein the anion exchange resin is disposed on the upstream side of the cation exchange resin disposed on the downstream side. When the onium hydroxide solution to be treated contains only a slight amount of the photoresist, however, the cation exchange resin may be disposed on the upstream side of the anion exchange resin disposed on the downstream side. Further, an upstream column or tower packed with the anion exchange resin may be disposed separately from but used in connection with a downstream column or tower packed with the cation exchange resin. In this case, only one of the anion and cation exchange resins, when lowered in ion exchange capacity or deteriorated through long-time service, can conveniently be easily replaced with the virgin one.

Examples of the anion exchange material that may be used in the present invention include commercially available anion exchange resins such as the styrene, acrylic or like type anion exchange resins which may be in a fibrous, granular or like form. The anion exchange materials may be used either alone or in the form of a mixture or a stratified structure of a plurality thereof at an arbitrary proportion. Styrene type anion exchange resins are especially useful in removing photoresists. Acrylic type anion exchange resins are those obtained by crosslinking (meth)acrylic acid and an ester(s) thereof with divinylbenzene (DVB) or the like. Strongly basic anion exchange resins also are useful in removing photoresistsi but weakly basic anion exchange resins also exert a photoresist-removing effect particularly on the neutral or acidic side. Thus, a plurality of strongly and weakly basic anion exchange resins may also be used in the form of either a mixture or a stratified structure at an arbitrary proportion. Although the counter ions of an anion exchange resin may be either OH—,or Cl—or the like, use of an anion exchange resin in the OH form, which has OH—ions as the counter ions, is preferred. This is so because use of an anion exchange resin in the Cl or like form, which has Cl—or like ions as the counter ions, results in conversion of at least part of the counter ions of the onium ions into Cl—or like ions. When a weakly basic anion exchange resin is used on the neutral or acidic side, or when an anion exchange resin in the Cl or like form is used, the onium salts can be reconverted to the hydroxide form by procedures known to those skilled in the art.

Examples of the cation exchange material in the H ion or onium ion form that may be used in the ultrapurification step of the present invention include the cation exchange materials described above and which may be either weakly acidic or strongly acidic. They may be used either alone or in the form of a mixture or a stratified structure of a plurality thereof at an arbitrary proportion.

Commercially available cation exchange materials are usually in the H form or in the sodium ion form (Na form). Such a cation exchange resin (preferably converted into the H form if originally in the Na form) may preliminarily be converted into the onium form before service thereof to prevent occurrence of a phenomenon that onium cation is adsorbed on the cation exchange resin in the initial stage of solution passage through the cation exchange resin to lower the onium concentration of the resultant treated solution. More specifically, use of a cation exchange resin, after converted into the onium cation form, is preferred though it can be used in the H form as it is. However, the cation exchange resin not completely in the onium form but partially in the H form may also be used, or both of a cation exchange resin in the H form and a cation exchange resin in the onium form may further alternatively be used in the form of either a mixture or a stratified structure at an arbitrary proportion.

Use of either the anion exchange resin or the cation exchange resin alternately treated with an aqueous alkali solution and an aqueous acid solution and then well washed with (ultra)pure water is preferred in order to make it free from any matter that may be leached out therefrom during the course of service thereof.

Which one of an anion exchange resin and a cation exchange resin, or both to use as the ion exchange resin may be determined based on the permissible amounts of various impurities such as the photoresist, other anions and cations that may be left in an onium hydroxide solution to be rejuvenated in connection with a use of that solution. In the case where the rejuvenated onium hydroxide solution is used as a developer for use in production of, for example, electronic parts such as semiconductor devices, liquid crystal displays and printed boards as described above, however, both of the anion exchange resin and the cation exchange resin are desirably used.

The following examples illustrate the process of the present invention. Unless otherwise indicated in the examples, and elsewhere in the specification and claims, all parts and percentages are by weight, temperatures are in degrees centigrade, and pressure is at or near atmospheric.

EXAMPLE 1

A commercial cation exchange resin made by Bayer AG, identified as CNP-80 is used to fill a 2.2 centimeter diameter column to a resin height of about 53 cm. The cation exchange material is in the regenerated (hydronium ion) form. Fourteen liters of a waste aqueous solution with a concentration of 0.5 w % tetramethylammonium hydroxide (TMAH) is passed through the resin column at a flow rate of 800 ml./hour. The TMA cation in the aqueous solution is adsorbed onto the cation exchange resin. Because the resin is specific to cations, anions and organic impurities contained in the dilute waste stream pass through the resin, and the effluent containing a higher concentration of such impurities can be discarded. The TMA cation is then eluted from the cation exchange resin using 800 ml. of an aqueous 10 w % sodium hydroxide solution which is pumped through the column at a flow rate of about 200 ml./hour. The sodium hydroxide solution is followed with 600 ml. of deionized water at a flow rate of 200 ml./hour. The solution emerging from the cation exchange column as effluent separated into 3 separate fractions. The first 200 ml. of effluent is separated as the first effluent. This dilute fraction which has a composition of 63 parts per billion (w) of sodium and 0.4 w % TMAH can be reused or discarded as waste. The next 600 ml. of effluent is collected separately as the second effluent. It contains 1.4 w % sodium hydroxide and 10% TMAH. This fraction is the desired solution of TMAH. Finally, the next 600 ml. of effluent from the column is collected, and this fraction contains 2.5 w % sodium hydroxide and 2.2 w % TMAH. This dilute fraction can be reused (for example as a source of sodium hydroxide) or discarded as waste.

The cation exchange resin column utilized in this example can be prepared for reuse by passing 700 ml. of 6.7 w % sulfuric acid at a flow rate of 1500 ml./hour followed by 600 ml. of deionized water. The solutions collected from this step contain 200 parts per million (w) TMAH and can be discarded as waste.

EXAMPLE 2

This example illustrates the process of the present invention wherein the TMAH solution recovered in Example 1 as product (second fraction) is further purified by contacting the product solution with a second cation exchange resin column wherein the resin is in the TMA ion form. The second cation exchange resin column wherein the resin is in the TMA cation form can be prepared by passing a TMAH solution through a cation exchange resin column by the procedure such as described in Example 1.

Accordingly, the 600 ml. solution recovered as the second effluent in Example 1 and which contains 1% by weight of sodium hydroxide and 10% by weight of TMAH is passed through the second cation exchange resin column wherein the resin is CNP-80 and is in TMA cation form. The TMAH passes through the column whereas sodium ions and other cation impurities are adsorbed by the resin in the second column thereby removing impurities from the solution.

The first 200 ml. of solution exiting the second ion exchange resin column is collected as the first effluent and this effluent has a composition of 26 ppm sodium hydroxide and 0.4% by weight TMAH. This dilute fraction can be reused or discarded as waste. The next 600 ml. of effluent is collected as the second effluent and is considered to be the product of the process which contains 14 w % TMAH and only 200 parts per billion of sodium. The third and last fraction comprising 600 ml. is collected and is found to contain 3% TMAH and 4% sodium hydroxide. This dilute stream can be reused or discarded as waste.

The cation exchange resin column is prepared for reuse by passing 600 ml. of 6.7 w % sulfuric acid followed by 100 ml. of deionized water through the used column at a flow rate of 1400 ml./hour. The solutions collected from this step contain less than 10 parts per million by weight of TMAH and can be discarded as waste.

EXAMPLE 3

This example utilizes cation exchange resin CNP-80 in a 2.0 centimeter diameter column with a resin height of 20 cm. The resin is in the regenerated hydronium ion form. Five liters of a waste solution with a concentration of 0.5 w % tetraethylammonium hydroxide (TEAH) are passed through the resin column. The TEA cation in the aqueous solution is adsorbed onto the cation exchange resin. The TEAH then is eluted from the resin using an aqueous solution containing 10 w % of sodium hydroxide which is pumped through the column at a flow rate of 100 to 150 ml./hour. The sodium hydroxide solution is followed with deionized water at a flow rate of 100 to 150 ml./hour.

The solution emerging from the ion exchange column as effluent is collected in three separate fractions. The first 100 ml. of effluent is separated as the first effluent, and this fraction contains 5 parts per billion by weight of sodium and 0.05 w % of TEAH. The next 300 ml. of effluent is collected as product and this effluent contains 0.6 w % sodium hydroxide and 8% TEAH. The next 200 ml. of effluent from the column is collected and this fraction is found to contain 2.3 w % sodium hydroxide and 1 w % TEAH. This dilute fraction can be reused or discarded as waste.

EXAMPLE 4

In this example, a cation exchange material commercially available from Mitsubishi under the designation WK-40 is used in a 2.2 cm diameter column with a resin height of 53 cm. The cation exchange material is in the regenerated hydronium ion form. A waste aqueous solution (16.7 liters) with a concentration of 0.48 w % TMAH is passed through the column. The TMA cations in the aqueous solution are adsorbed onto the cation exchange resin. Thereafter, TMAH is eluted from the resin by passing an aqueous solution containing 14 w % potassium hydroxide through the column at a flow rate of 200 ml./hour. The potassium hydroxide solution is followed with deionized water. The solution emerging from the ion exchange column as effluent is collected in 3 separate fractions. The first 200 ml. of effluent is separated as the first effluent, and this fraction is found to contain 0.30 w % TMAH. This dilute fraction can be reused or discarded as waste. The next 600 ml. of effluent is collected as the product, and this fraction contains 0.7 w % potassium hydroxide and 11.9 w % TMAH. The next 500 ml. of effluent is collected, and this fraction is found to contain 7.08% potassium hydroxide and 1.1 w % TMAH. This dilute fraction can be reused or discarded as waste.

EXAMPLE 5

In this example, the cation exchange material which is utilized is WK-40 in the regenerated hydronium ion form, and the exchange resin is contained in a 2.2 cm diameter column with a resin height of 53 cm. Sixteen liters of a waste aqueous solution with a concentration of 0.5 w % TMAH is passed through the resin column, and the TMA cations are adsorbed onto the cation exchange resin. Thereafter, TMAH is eluted from the resin using an aqueous solution containing 6.0 w % lithium hydroxide which is pumped through the column at a flow rate of 200 ml./hour. The lithium hydroxide solution is followed with deionized water. The solution emerging from the ion exchange column as effluent is collected in 3 separate fractions. The first 200 ml. of effluent is separated as the first effluent, and this fraction has a concentration of 0.16 w % TMAH. The next 600 ml. of effluent is collected as the product, and the product contains 0.03 w % lithium hydroxide and 11.3 w % TMAH. The third fraction is collected and discarded.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A process for recovering an onium hydroxide from a cation exchange material having onium cations adsorbed thereto which comprises (A) contacting said cation exchange material with an aqueous solution of an inorganic hydroxide to form an onium hydroxide, and B) recovering an aqueous solution of the onium hydroxide.

2. The process of claim 1 wherein the onium cation is a quaternary ammonium cation, a quaternary phosphonium cation, or a tertiary sulfonium cation.

3. The process of claim 1 wherein the onium cation is a quaternary ammonium cation.

4. The process of claim 3 wherein the quaternary ammonium cation is characterized by the formula

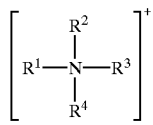

wherein $R^1$, $R^2$, $R^3$ and $R^4$ are each independently alkyl groups containing from 1 to about 10 carbon atoms, hydroxyalkyl or alkoxyalkyl groups containing 2 to about 10 carbon atoms, or aryl or hydroxyaryl groups, or $R^1$ and $R^2$ are alkyl groups which together with the nitrogen atom may form an aromatic or non-aromatic heterocyclic ring provided that if the heterocyclic group contains a —C=N—, $R^3$ is the second bond.

5. A process for recovering a quaternary ammonium hydroxide from a cation exchange material having quaternary ammonium cations adsorbed thereto which comprises (A) contacting said cation exchange material with an aqueous solution of an alkali metal hydroxide to elute a quaternary ammonium hydroxide, and (B) recovering an aqueous solution of the quaternary ammonium hydroxide.

6. The process of claim 5 wherein the alkali metal hydroxide is selected from sodium hydroxide, potassium hydroxide and lithium hydroxide.

7. The process of claim 5 wherein the quaternary ammonium cations adsorbed to the cation exchange material is characterized by the formula

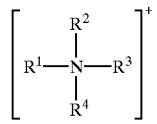

wherein $R^1$, $R^2$, $R^3$ and $R^4$ are each independently alkyl groups containing from 1 to about 10 carbon atoms, hydroxyalkyl or alkoxyalkyl groups containing 2 to about 10 carbon atoms, or aryl or hydroxyaryl groups, or $R^1$ and $R^2$ are alkyl groups which together with the nitrogen atom may form an aromatic or non-aromatic heterocyclic ring provided that if the heterocyclic group contains a —C=N—, $R^3$ is the second bond.

8. The process of claim 7 wherein $R^1$, $R^2$, $R^3$ and $R^4$ are alkyl groups containing from 1 to 5 carbon atoms.

9. The process of claim 7 wherein $R^1$, $R^2$, $R^3$ and $R^4$ are alkyl groups containing 1 or 2 carbon atoms.

10. A process for recovering onium hydroxides from a solution containing an onium compound comprising (A) contacting the solution containing an onium compound which comprises an onium cation and an anion with a cation exchange material in the hydrogen form whereby at least a portion of the onium cations are adsorbed on the cation exchange material;

(B) contacting the cation exchange material containing the adsorbed onium cation with an aqueous solution of an inorganic hydroxide to elute an onium hydroxide; and (C) recovering the eluted onium hydroxide solution.

11. The process of claim 10 wherein the onium compound is a quaternary ammonium salt.

12. The process of claim 10 wherein the onium compound is selected from a quaternary ammonium hydroxide, a quaternary phosphonium hydroxide, or a tertiary sulfonium hydroxide.

13. The process of claim 10 wherein the onium compound is selected from onium hydroxides and onium salts.

14. The process of claim 13 wherein the onium salts are selected from the bicarbonates, halides, nitrates, formates, acetates, sulfates, carbonates and phosphates.

15. The process of claim 10 wherein the onium compound is a quaternary ammonium compound.

16. The process of claim 15 wherein the quaternary ammonium compound is characterized by the formula

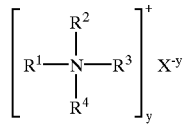

wherein $R^1$, $R^2$, $R^3$ and $R^4$ are each independently alkyl groups containing from 1 to about 10 carbon atoms, hydroxyalkyl or alkoxyalkyl groups containing 2 to about 10 carbon atoms, or aryl or hydroxyaryl groups, or $R^1$ and $R^2$ are alkyl groups which together with the nitrogen atom may form an aromatic or non-aromatic heterocyclic ring provided that if the heterocyclic group contains a —C=N—, $R^3$ is the second bond; X is a hydroxide anion or an anion of an acid; and y is a number equal to the valence of X.

17. The process of claim 16 wherein X is a halide, hydroxide, sulfate, phosphate or carbonate anion.

18. The process of claim 16 wherein X is a hydroxyl anion.

19. The process of claim 16 wherein $R^1$, $R^2$, $R^3$ and $R^4$ are alkyl groups comprising 1 to about 4 carbon atoms or a hydroxyalkyl group containing from 2 to 5 carbon atoms.

20. The process of claim 16 wherein the alkali metal hydroxide is selected from sodium hydroxide, potassium hydroxide, and lithiurh hydroxide.

21. A process for recovering a quaternary ammonium hydroxide from an aqueous solution containing a quaternary ammonium compound comprising
(A) contacting the solution containing the quaternary ammonium compound with a cation exchange material in hydrogen form whereby at least a portion of the quaternary ammonium cations are adsorbed by the cation exchange material;
(B) contacting the cation exchange material containing the adsorbed quaternary ammonium cations with an aqueous solution of an alkali metal hydroxide selected from sodium hydroxide, potassium hydroxide and lithium hydroxide to elute a quaternary ammonium hydroxide solution; and
(C) recovering the eluted quaternary ammonium hydroxide solution which contains a quantity of the alkali metal hydroxide.

22. The process of claim 21 wherein the alkali metal hydroxide is selected from sodium hydroxide, potassium hydroxide and lithium hydroxide.

23. The process of claim 21 wherein the quaternary ammonium compound is characterized by the formula

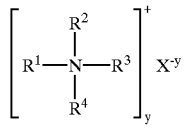

wherein $R^1$, $R^2$, $R^3$ and $R^4$ are each independently alkyl groups containing from 1 to about 10 carbon atoms, hydroxyalkyl or alkoxyalkyl groups containing 2 to about 10 carbon atoms, aryl or hydroxyaryl groups, or $R^1$ and $R^2$ are alkyl groups which together with the nitrogen atom may form an aromatic or non-aromatic heterocyclic ring provided that if the heterocyclic group contains a —C=N—, $R^3$ is the second bond; X is a hydroxide anion or an anion of an acid; and y is a number equal to the valence of X.

24. The process of claim 23 wherein X is a halide, hydroxide, sulfate, phosphate, formate, acetate, or carbonate anion.

25. The process of claim 23 wherein X is a hydroxyl anion.

26. The process of claim 23 wherein $R^1$, $R^2$, $R^3$ and $R^4$ are alkyl groups containing from 1 to about 4 carbon atoms or a hydroxyalkyl group containing from 2 to 5 carbon atoms.

27. A process for recovering an onium hydroxide from a cation exchange material having onium cations adsorbed thereto which comprises
(A) contacting said cation exchange material with an aqueous solution of an inorganic hydroxide to form an onium hydroxide,
(B) recovering an queous solution of the onium hydroxide,
(C) contacting the aqueous solution recovered in (B) with a cation exchange material having adsorbed onium cations which are the same as the cations adsorbed on the cation exchange material used in step (A) whereby at least a portion of the cations of the inorganic hydroxide contained in the solution are adsorbed by the cation exchange material, and
(D) recovering an onium hydroxide solution containing a reduced amount of inorganic hydroxide.

28. The process of claim 27 wherein the onium hydroxide solution recovered in (D) is further purified by
(E) contacting the onium hydroxide solution recovered in (D) with an anion exchange material in hydroxyl form and a cation exchange material in onium form wherein the onium cation is the same as the onium cation adsorbed on the cation exchange material in (A), separately or in any order, or as a mixture.

29. A process for recovering a quaternary ammonium hydroxide from a cation exchange material having quaternary ammonium cations adsorbed thereto which comprises
(A) contacting said cation exchange material with an aqueous solution of an alkali metal hydroxide to elute a quaternary ammonium hydroxide,
(B) recovering an aqueous solution of the quaternary ammonium hydroxide,
(C) contacting the solution recovered in (B) with a cation exchange material having adsorbed quaternary ammonium cations which are the same as the cations adsorbed on the cation exchange material used in (A) whereby at least a portion of the alkali metal cations contained in the solution are adsorbed by the cation exchange material, and
(D) recovering a quaternary ammonium hydroxide solution containing a reduced amount of alkali metal.

30. The process of claim 29 wherein the quaternary ammonium hydroxide solution recovered in (D) is further purified by
(E) contacting the quaternary ammonium hydroxide solution recovered in (D) with an anion exchange material in hydroxyl form and a cation exchange material in quaternary ammonium form wherein the quaternary ammonium cation is the same as the quaternary ammonium cation adsorbed on the cation exchange material in (A), separately or in any order, or as a mixture.

31. A process for recovering onium hydroxides from a solution containing an onium compound comprising
(A) contacting the solution containing an onium compound which comprises an onium cation and an anion with a cation exchange material in the hydrogen form whereby at least a portion of the onium cations are adsorbed on the cation exchange material;
(B) contacting the cation exchange material containing the adsorbed onium cation with an aqueous solution of an inorganic hydroxide to elute an onium hydroxide;
(D) contacting the solution recovered in (B) with a cation exchange material having absorbed onium cations whereby at least a portion of the alkali metal cations are adsorbed by the cation exchange material, and
(E) recovering an onium hydroxide solution containing a reduced amount of alkali metal ions.

32. (New) The process of claim 31 wherein the onium hydroxide solution recovered in step (E) is further purified by
(F) contacting the onium hydroxide solution recovered in (E) with an anion exchange material in the hydroxyl form and a cation exchange material in the onium form, separately and in any order, or as a mixture.

33. The process of claim 32 wherein the onium hydroxide solution is contacted with the anion exchange material in hydroxyl form and thereafter contacted with the cation exchange resin in onium form.

34. A process for recovering a quaternary ammonium hydroxide from an aqueous solution containing a quaternary ammonium compound comprising (A) contacting the solution containing the quaternary ammonium compound with a cation exchange material in hydrogen form whereby at least a portion of the quaternary ammonium cations are adsorbed by the cation exchange material;

(B) contacting the cation exchange material containing the adsorbed quaternary ammonium cations with an aqueous solution of an alkali metal hydroxide selected from sodium hydroxide, potassium hydroxide and lithium hydroxide to elute a quaternary ammonium hydroxide solution;

(C) recovering the eluted quaternary ammonium hydroxide solution which contains a quantity of the alkali metal hydroxide;

(D) contacting the solution recovered in (C) with a cation exchange material in the quaternary ammonium form whereby at least a portion of the alkali metal cations in the solution are adsorbed by the cation exchange material; and (E) recovering the quaternary ammonium hydroxide solution containing a reduced quantity of the alkali metal.

35. The process of claim 34 wherein quaternary ammonium hydroxide solution recovered in (E) is further purified by (F) contacting the quaternary ammonium hydroxide solution recovered in (E) with an anion exchange material in hydroxyl form and a cationic exchange material in quaternary ammonium form, separately or in any order, or as a mixture.

36. The process of claim 35 wherein the quaternary ammonium hydroxide solution is contacted with the anion exchange material in hydroxyl form and thereafter contacted with a cation exchange resin in quaternary ammonium form.

* * * * *